US012435736B1

(12) United States Patent
Curtis et al.

(10) Patent No.: US 12,435,736 B1
(45) Date of Patent: Oct. 7, 2025

(54) FAN GUARD FOR FAN

(71) Applicant: Cisco Technology, Inc., San Jose, CA (US)

(72) Inventors: George Edward Curtis, San Jose, CA (US); Vic Hong Chia, Sunnyvale, CA (US); Chejung Liu, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 18/625,947

(22) Filed: Apr. 3, 2024

(51) Int. Cl.

| | |
|---|---|
| ***F04D 29/54*** | (2006.01) |
| ***E04C 2/32*** | (2006.01) |
| ***F04D 19/00*** | (2006.01) |
| ***F04D 29/32*** | (2006.01) |
| ***F04D 29/70*** | (2006.01) |
| ***F24F 1/38*** | (2011.01) |
| ***F24F 13/08*** | (2006.01) |
| ***F24F 13/20*** | (2006.01) |
| *H05K 7/20* | (2006.01) |

(52) U.S. Cl.
CPC ......... *F04D 29/703* (2013.01); *F04D 19/002* (2013.01); *H05K 7/20736* (2013.01)

(58) Field of Classification Search
CPC ...... F04D 29/703; F04D 29/54; F04D 19/002; F24F 13/08; F24F 13/20
See application file for complete search history.

(56) References Cited

U.S. PATENT DOCUMENTS

| | | | |
|---|---|---|---|
| 2004/0033135 | A1 | 2/2004 | Chang |
| 2017/0370380 | A1 | 12/2017 | Beck et al. |
| 2021/0324878 | A1 | 10/2021 | Chen et al. |

FOREIGN PATENT DOCUMENTS

| | | | | | |
|---|---|---|---|---|---|
| CN | 113250979 | A * | 8/2021 | | F04D 19/002 |
| JP | 2013036703 | A * | 2/2013 | | F24F 1/38 |
| WO | 2016121485 | A1 | 8/2016 | | |
| WO | 2019215783 | A1 | 11/2019 | | |

OTHER PUBLICATIONS

English translation of CN 113250979 by PE2E Aug. 8, 2024.*
English translation of JP 2013036703 by PE2E Jan. 16, 2025.*
Wisconsin Metal Parts, "What is Progressive Stamping Die?", YouTube, https://www.youtube.com/watch?v=NuFpzJLMnFst=65s, Jan. 29, 2019, 3 pages.

* cited by examiner

*Primary Examiner* — Deming Wan
(74) *Attorney, Agent, or Firm* — Edell, Shapiro & Finnan, LLC

(57) ABSTRACT

A fan guard that includes an array of openings disposed adjacent to one another along a plane to enable flow of air directed transverse to the plane, segments that each include a face extending along the plane and a thickness extending transverse to the plane, and flanges connected to the segments to cooperatively form the array of openings. Each flange includes a depth extending transverse to the plane, the depth being greater than the thickness of each segment of the plurality of segments.

20 Claims, 8 Drawing Sheets

FAN GUARD FOR FAN

TECHNICAL FIELD

The present disclosure relates to a fan guard for a fan.

BACKGROUND

A fan provides cooling to an electrical device, component, and/or system, such as a server rack. For example, the fan may direct an airflow through an enclosure of the electrical device to cool the electrical device via convection. The cooling of the electrical device provided by the fan may reduce or limit a temperature increase of the electrical device to maintain a structural integrity and prolong the useful lifespan of the electrical device. It may be desirable for the fan to operate to attenuate radiated emissions (e.g., created by system electronics) that otherwise may affect operation of the electrical device.

DETAILED DESCRIPTION

Overview

Figure 1:
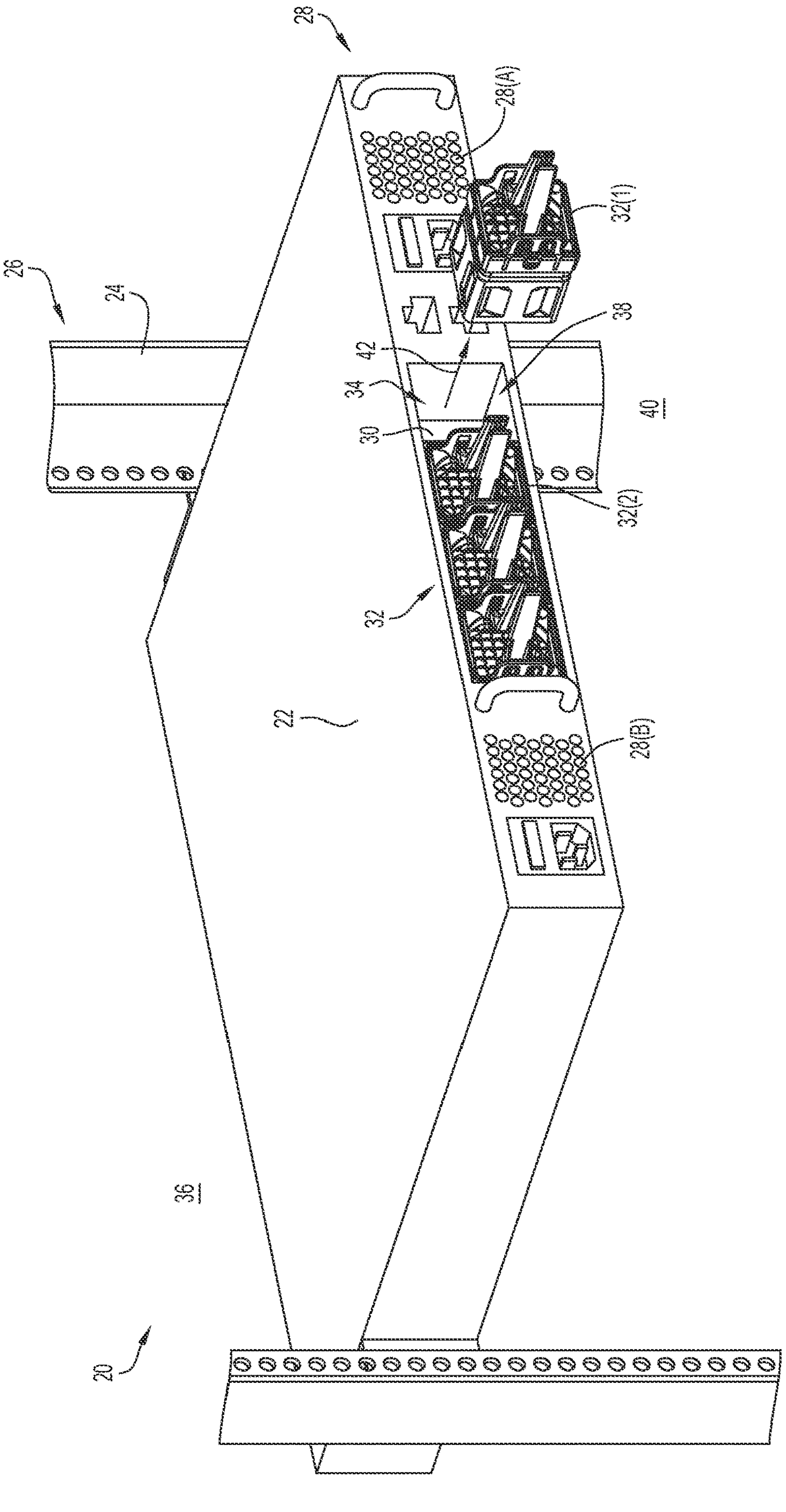
FIG. 1 is a rear perspective view of an electrical device coupled to multiple fans, according to an example embodiment.

The present disclosure is directed to a fan guard for a fan. In some aspects, the techniques described herein relate to an apparatus including: a plurality of segments, wherein each segment of the plurality of segments comprises a face extending along a plane and a thickness extending transverse to the plane; and a plurality of flanges, wherein each flange of the plurality of flanges is connected to a respective segment of the plurality of segments to cooperatively form an array of openings, wherein openings of the array of openings are adjacent to one another along the plane to enable flow of air directed transverse to the plane, and each flange has a depth extending transverse to the plane, the depth being greater than the thickness of each segment of the plurality of segments.

In other aspects, the techniques described herein relate to an apparatus including: a plurality of fan blades configured to move to direct an airflow along an axis; and a fan guard with: a plurality of segments, wherein each segment of the plurality of segments comprises a thickness extending along the axis along which the plurality of blades is configured to direct the airflow; and a plurality of flanges, wherein each flange of the plurality of flanges is coupled to a respective segment of the plurality of segments to cooperatively form an array of openings configured to receive the airflow directed by the plurality of fan blades along the axis, and each flange extends along the axis beyond the thickness of each segment of the plurality of segments.

In additional aspects, the techniques described herein relate to an apparatus including: a plurality of segments of a fan guard, wherein each segment of the plurality of segments comprises a face extending along a plane and a thickness extending along an axis transverse to the plane; and a plurality of flanges of the fan guard, wherein the plurality of flanges is connected to the plurality of segments to cooperatively form a plurality of openings positioned adjacent to one another along the plane, and each flange of the plurality of flanges extends along the axis beyond the thickness of each segment of the plurality of segments.

Example Embodiments

Embodiments of the present disclosure are directed to a fan guard with bent flanges. The fan guard may be implemented to shield or protect blades of a fan. For example, the blades may be configured to move (e.g., rotate) to direct air, and the fan guard may be configured to at least partially shield the blades. The fan guard may include openings to enable air directed by the blades to flow therethrough. In some embodiments, the fan may be configured to couple to an electrical device to direct air through or across the electrical device, thereby reducing a temperature of or limiting a temperature increase of the electrical device.

The fan guard may include a plurality of segments and a plurality of flanges that are connected to one another to form openings that are adjacent to one another along a plane to enable airflow therethrough in a direction transverse to the plane. For example, each segment may include a face extending along the plane and a thickness extending transverse to the plane (e.g., along the direction of airflow through the openings). Each flange may extend (e.g., along the direction of airflow through the openings) at a depth transverse to the plane, and the depth of each flange may be greater than the thickness of each segment. That is, each flange may extend beyond the thickness of each segment.

The arrangement of the flanges relative to the segments may define sufficiently sized openings that enable a desirable amount of airflow (e.g., above a threshold flow rate) through the fan guard. Thus, the fan guard may enable the fan to provide a desirable amount of cooling of the electrical device. Additionally, the extension of the flanges at the depth may absorb or block certain electromagnetic interference (EMI), such as noise (e.g., generated by operation of the fan and system electronics). For example, the extension of the flanges may provide the fan guard with a sufficient amount of material to block EMI radiation between a particular range of frequencies. Thus, the fan may contribute to a system Faraday cage that attenuates radiated emissions. Consequently, an amount of EMI directed to and/or from the electrical device may be reduced, and operation of the electrical device may be improved as a result.

With reference made to FIG. 1, depicted therein is an electronic device 20, such as a server device. The electronic device 20 may include a chassis 22 configured to mount to rails 24 of an electronic equipment rack 26 (e.g., a server rack). The electronic device 20 may include a set of power sources 28(A), 28(B) (collectively, power sources 28), e.g., one or more power supplies or power converters/conditioners, configured to supply electric power and electronic circuitry 30 configured to perform electronic operations (e.g., data communications operations, data processing operations) by drawing electric power from the power sources 28. Additionally, the electronic device 20 may include multiple fans 32 that each are configured to extend into a respective duct 34 defined by the chassis 22. Each fan 32 may provide cooling to the electronic circuitry 30. By way of example, the fans 32 may draw external ambient air from a first side 36 (e.g., a front side) of the electronic equipment rack 26 through an interior 38 of the electronic device 20 defined by the chassis 22 and discharge exhaust air out of a second side 40 (e.g., a back side), opposite the first side 36, of the electronic equipment rack 26, thereby removing heat from the electronic circuitry 30.

Each fan 32 may be readily coupled to and decoupled from the chassis 22 (e.g., via fasteners) to facilitate ease of modifying the electronic device 20. For example, a user (e.g., an operator, a technician) may decouple one of the fans 32 from the chassis 22 for inspection, repair, and/or replacement of the fan without having to suspend or otherwise modify operation of the electronic device 20 (e.g., of the electronic circuitry 30). Thus, an operational efficiency of the electronic device 20 may be maintained. Indeed, while one of the fans 32(1) is decoupled from the chassis 22, another fan 32(2) coupled to the chassis 22 may remain in operation to continue to provide some amount of cooling of the electronic device 20. Moreover, in certain embodiments, each of the fans 32 may be of the same embodiment. That is, a single embodiment of the fans 32 may be coupled to different parts of the chassis 22 to cool the electronic device 20. Thus, different embodiments of fans 32, each dedicated for a particular implementation (e.g., coupling to a particular portion of the chassis 22), may be avoided. For instance, the same embodiment of fans 32 may be used to replace one another without having to manufacture and/or purchase other embodiments of fans 32. As such, an ease of assembling and/or modifying the electronic device 20 using the fans 32 may be facilitated.

During operation, the fans 32 may draw power from the power sources 28 to direct air through the chassis 22. Additionally, operation of the electronic device 20 (e.g., certain components of the electronic device 20) may generate noise and other EMI that can affect operation of other electronic equipment and components. For this reason, it may be desirable to attenuate such EMI. To this end, each fan 32 may include a fan guard configured to attenuate EMI, such as EMI of a particular frequency or frequency range. For example, as discussed herein, the fan guards may include segments and flanges that are arranged to form openings that enable sufficient airflow therethrough to cool the electronic device 20 while also provide a sufficient amount of material to attenuate EMI desirably.

Figure 2:
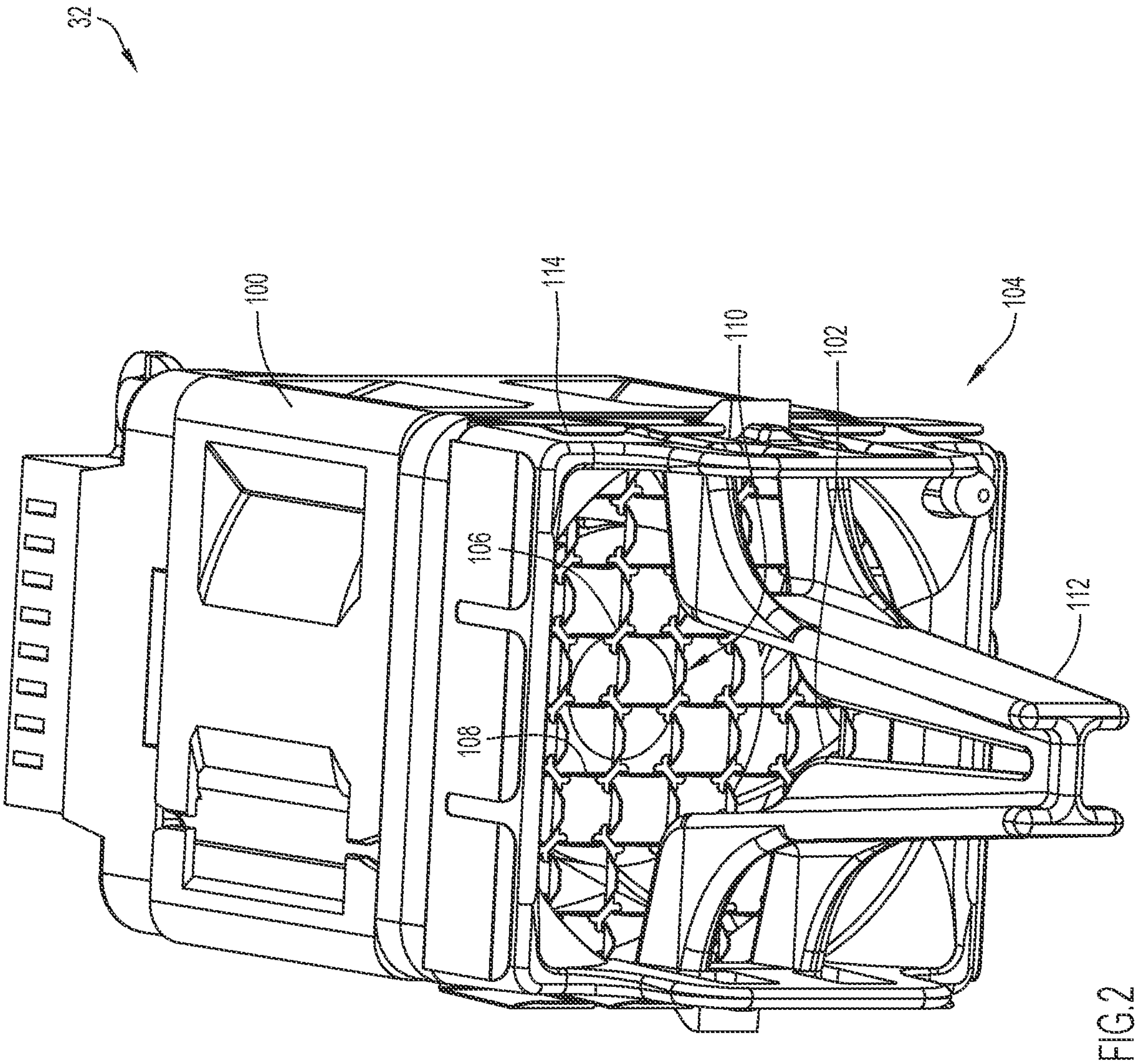
FIG. 2 is a rear perspective view of an embodiment of a fan configured to couple to the electrical device of FIG. 1, according to an example embodiment.

FIG. 2 is a rear perspective view of one of the fans 32. The fan 32 may include a motor 100 and blades 102 coupled to the motor 100 (e.g., to a shaft of the motor 100). During operation of the fan 32, the motor 100 may be configured to use electric power (e.g., supplied by the power sources 28) to drive movement, such as rotation, of the blades 102 to direct air. As an example, the motor 100 may be configured to couple to the electronic circuitry 30, and the electronic circuitry 30 may control operation of the motor 100 to move the blades 102, such as to control initialization, suspension, and/or adjustment (e.g., of a rotational speed) of the operation of the blades 102.

The fan 32 may also include a fan guard 104 (e.g., an EMI shield) configured to couple to the motor 100. The fan guard 104 may at least partially cover and enclose the blades 102, thereby shielding and protecting the blades 102. The fan guard 104 may include segments 106 and flanges 108 that are coupled to one another and arranged to define an array of openings 110. The openings 110 are positioned adjacent to the blades 102 to enable movement of the blades 102 to drive air through the openings 110 and therefore through the electrical device 20 while the fan 32 is coupled to the chassis 22 of the electrical device 20.

The fan 32 may further include an attachment assembly 112 configured to couple to the fan guard 104. For example, the fan guard 104 may include multiple tabs 114, and at least a portion of the attachment assembly 112 may be positioned between the tabs 114 and coupled to the fan guard 104 via an interference fit with the tabs 114. In other words, the tabs 114 may cooperatively capture the attachment assembly 112 to secure the attachment assembly 112 to the fan guard 104. The attachment assembly 112 may facilitate coupling and decoupling of the fan 32 with respect to the chassis 22. For example, a user may grip the attachment assembly 112 and impart a force to control positioning of the fan 32 with respect to the chassis 22. Thus, the attachment assembly 112 may further facilitate modification of the electronic device 20 by adjusting the arrangement of the fan 32.

Figure 3:
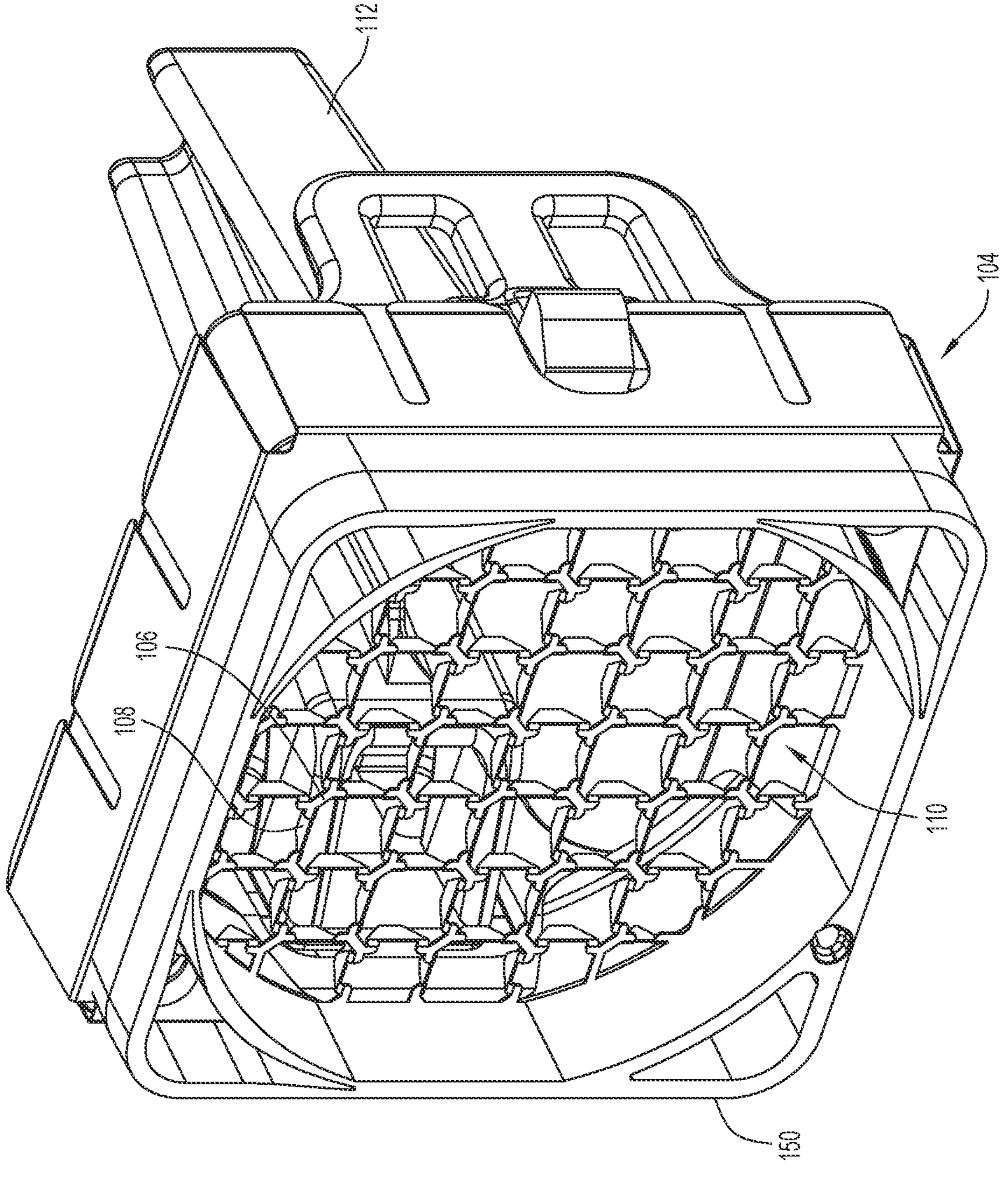
FIG. 3 is a rear perspective view of a fan guard of the fan of FIG. 2, the fan guard having bent flanges, according to an example embodiment.

FIG. 3 is a rear perspective view of the fan guard 104 coupled to the attachment assembly 112. The illustrated fan guard 104 is additionally coupled to a frame 150, such as via fasteners (not shown). For example, the frame 150 may be configured to couple to the motor 100, thereby coupling the fan guard 104 and the motor 100 to one another. As discussed herein, the fan guard 104 may include segments 106 and flanges 108 that extend from the segments 106 to form the openings 110. For example, the segments 106 and the flanges 108 may cooperatively form openings 110 that are arranged in aligned rows and columns. However, the segments 106 and the flanges 108 may cooperatively form openings 110 that are arranged in any other suitable manner, such as in offset rows and columns, in a concentric arrangement, and/or in a random distribution. The flanges 108 may extend from the segments 106 in a direction along which airflow may be directed through the openings 110. Although the illustrated flanges 108 extend from the segments 106 in a direction toward the attachment assembly 112 (e.g., away from the blades 102 while the fan 32 is assembled), the flanges 108 may extend in any suitable direction, such as a direction away from the attachment assembly 112 (e.g., toward the blades 102 while the fan 32 is assembled). Indeed, different flanges 108 may extend in different directions.

Figure 4:
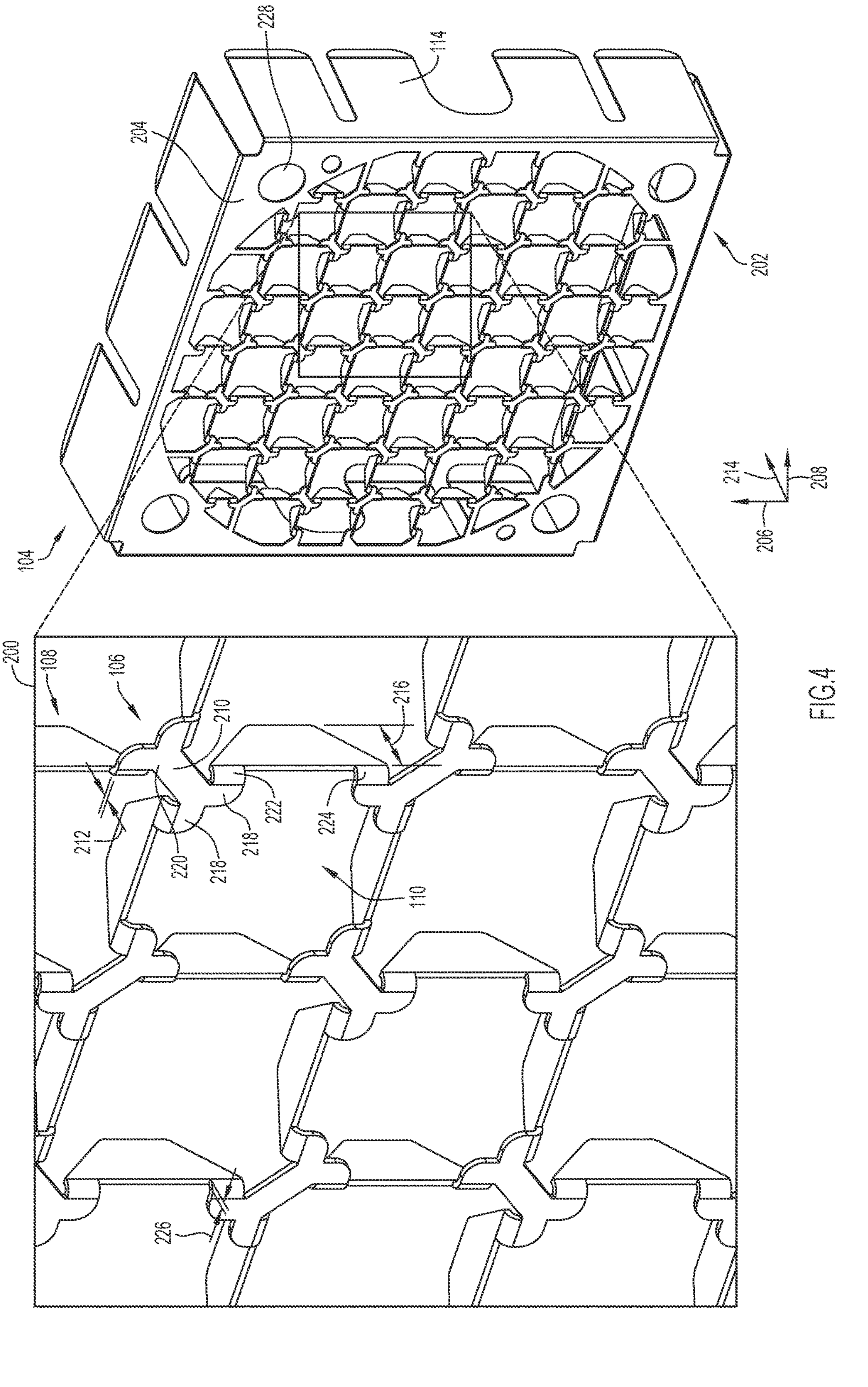
FIG. 4 is another rear perspective view of the fan guard of FIG. 3 further illustrating the bent flanges.

FIG. 4 is a rear perspective view of the fan guard 104 and includes a detailed view 200 so show additional details regarding the fan guard 104. In particular, the detailed view 200 further illustrates the segments 106 and the flanges 108 that are coupled to and extend from one another to form the openings 110. For example, the fan guard 104 may include a base 202 having a surface 204 that extends along a plane cooperatively formed by a first axis 206 (e.g., a vertical axis) and a second axis 208 (e.g., a lateral axis). A subset of the segments 106 may extend from the base 202, and the segments 106 and the flanges 108 may extend from one another. The openings 110 formed by the segments 106 and the flanges 108 may be positioned adjacent to one another along the plane. Therefore, each opening 110 may be configured to enable airflow (e.g., airflow directed by the blades 102) therethrough in a direction that is transverse, such as perpendicular, to the plane. Thus, the segments 106 and the flanges 108 are arranged to enable the fan 32 to direct airflow through the fan guard 104 and the electric device 20.

Additionally, the segments 106 and the flanges 108 may be oriented to provide sufficient EMI attenuation. As an example, each segment 106 may include a face 210 extending along the plane, as well as a thickness 212 extending along a third axis 214 (e.g., a longitudinal axis) that is transverse to the plane. For instance, the thickness 212 of each segment 106 may extend perpendicular to and be approximately equal in length as a thickness of the base 202. Further, each flange 108 may extend a particular depth 216 that is substantially greater than the thickness 212 of the segments 106. By way of example, the depth 216 of the flanges 108 may be a value between 1 millimeter (mm) and 1.5 mm (i.e., between 0.039 inches and 0.059 inches) or greater than 1.5 mm, whereas the thickness 212 of the segments 106 may be a value between 0.1 mm and 1 mm (i.e., between 0.006 inches and 0.06 inches) or less than 0.1 mm. Indeed, in some embodiments, the depth 216 of the flanges 108 may be multiple times greater than the thickness 212 of the segments 106. That is, a ratio of the depth 216 of each flange 108 relative to the thickness 212 of each segment is greater than 2.

Extending the flange 108 substantially beyond the thickness 212 of the segments 106 may provide the fan guard 104 with a sufficient amount of material to attenuate EMI while providing sufficiently sized openings 110. For example, increasing the extension of the flanges 108 along the third axis 214 may increase an amount of material of the flanges 108 without reducing a size of the openings 110 (e.g., that otherwise may occur by extending the flanges 108 along the first axis 206 and along the second axis 208). Thus, the extension of the flanges 108 along the third axis 214 may help attenuate EMI without reducing or impeding airflow through the fan guard 104.

Moreover, by providing sufficiently sized openings 110, the fan may be operated at a lower fan speed (e.g., the blades 102 may rotate at a lower speed) to deliver a desirable amount of airflow. The reduced fan speed of the fan may reduce or limit noise generated by operation of the fan. Additionally or alternatively, by increasing extension of the flanges 108 along the third axis 214, impingement of air against the flanges 108 may be reduced. That is, air flowing through the openings 110 may flow along the surface of the flanges 108 instead of deflecting off the surface of the flanges 108. As a result, noise that otherwise may be produced via interaction between the flanges 108 and the airflow may be reduced. Consequently, the arrangement of the flanges 108 may reduce or limit noise generated by operation of certain electronic components, further reducing potential EMI with respect to the electrical device 20.

In some embodiments, the fan guard 104 may be a monolithic, integral component. By way of example, the fan guard 104 may be formed from a single piece of sheet metal (e.g., steel, copper) by cutting and bending the sheet metal. For instance, the openings 110 may be partially formed by removing material (e.g., via a stamping technique) from the base 202 to create the segments 106 and flanges 108 that each initially extend along the plane cooperatively formed by the first axis 206 and the second axis 208. The flanges 108 may then be bent or twisted relative to the segments 106 such that depth 216 of the flanges 108 extends along the third axis 214, while the segments 106 continue to extend along the plane. To this end, the arrangement of the segments 106 and of the flanges 108 may facilitate bending of the flanges 108 relative to the segments 106. As an example, each segment 106 may include connector portions 218 that may each extend from or be coupled to a respective flange 108. In the detailed view 200, each of the segments 106 at least partially forms four adjacent openings 110. Therefore, each segment 106 may include four connector portions 218 to couple to four different adjacent flanges 108 that at least partially form one of those four adjacent openings 110. In addition, each segment 106 may include a main portion 220 that couples the connector portions 218 to one another. For example, the main portion 220 may extend in a direction transverse to the first axis 206 and to the second axis 208. Further, a first end 222 of each flange 108 may be coupled to one of the segments 106, and a second end 224, opposite the first end 222 (e.g., offset from the first end 222 along the first axis 206 or along the second axis 208), may be coupled to a different segment 106. Thus, each segment 106 may be coupled to multiple different flanges 108, and each flange 108 may be coupled to multiple different segment 106. In this manner, an amount of a flange 108 in continual connection with any one of the segments 106 may be reduced, thereby limiting a structural inflexibility between the flanges and the segments 106 to facilitate movement (e.g., rotation, flexure) of the flange 108 with respect to the segment 106. Moreover, the thickness 212 of the segments 106, which may be similar to a thickness 226 of the flanges 108, may be sufficiently small to facilitate movement of the flanges 108 with respect to the corresponding segments 106. Therefore the structural arrangement of the segments 106 and the flanges 108 may facilitate manufacture to form the openings 110.

The tabs 114 of the fan guard 104 may extend from the base 202 in a similar direction as that in which the flanges 108 extend (e.g., along the third axis 214). That is, each tab 114 may extend along the third axis 214, thereby forming a receptacle between the tabs 114 and along the base 202 (e.g., overlapping with the openings 110) configured to receive the attachment assembly 112. For example, the tabs 114 may be arranged to extend along the third axis 214 by bending the tabs 114 with respect to the base 202.

The base 202 may also include holes 228 that are separate from the openings 110. The holes 228 may help coupling of the fan guard 104 to the frame 150 and/or to the attachment assembly 112. For instance, fasteners may be extended through the holes 228, the attachment assembly 112, and/or the frame 150 to couple the fan guard 104, the attachment assembly 112, and/or the frame 150 to one another.

Figure 5:
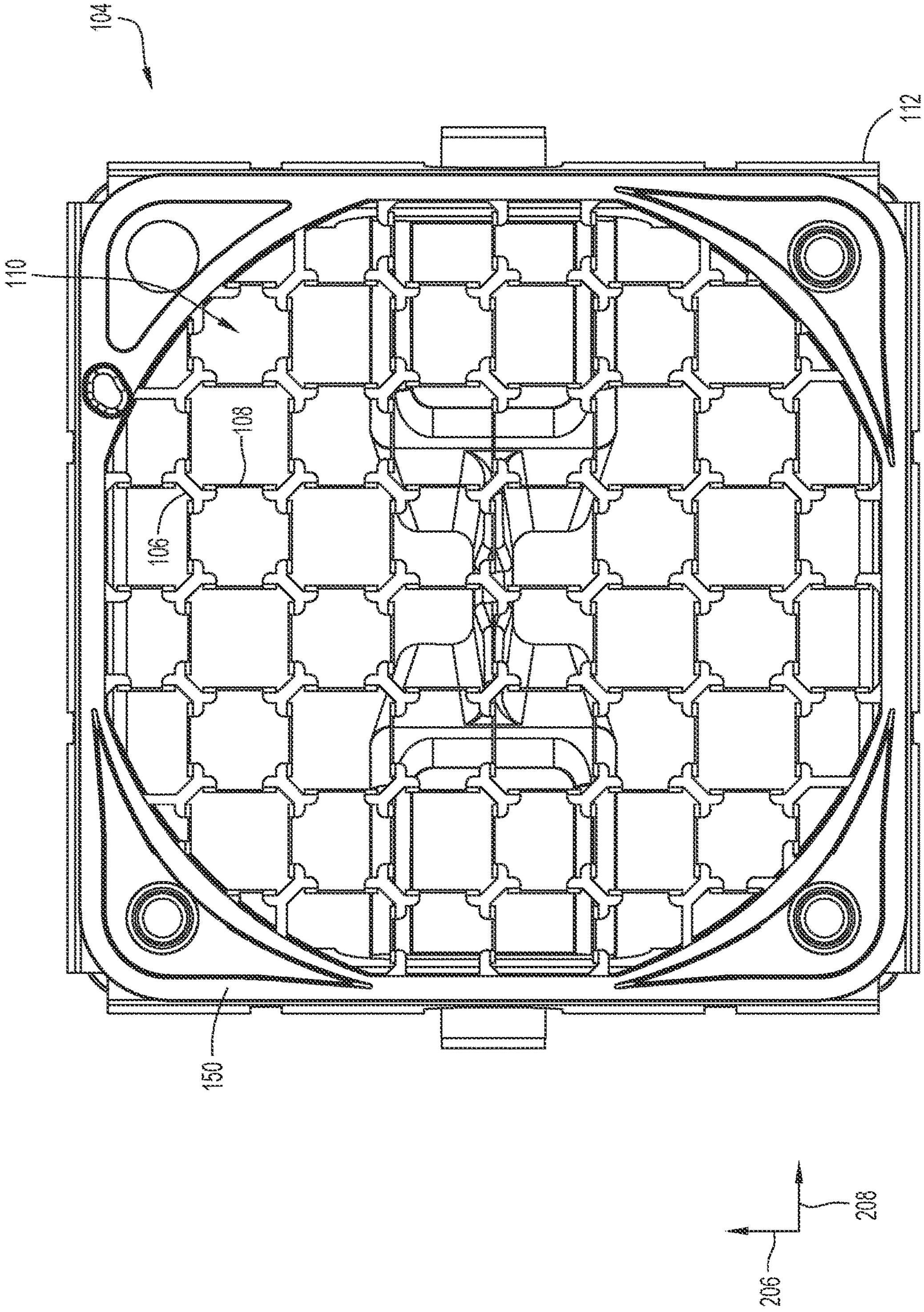
FIG. 5 is a front view of the fan guard of FIG. 3.

FIG. 5 is a front view of the fan guard 104 coupled to the frame 150 and to the attachment assembly 112. The openings 110 of the illustrated fan guard 104 have a rectangular shape and are each at least partially defined by four flanges 108 (e.g., each defining a respective side of the opening 110) and four segments 106 (e.g., each defining a respective corner of the opening 110). However, in additional or alternative embodiments, the openings 110 may have any other suitable shape, such as a circular shape, a hexagonal shape, an irregular shape, and so forth, that are at least partially defined by any suitable quantity of flanges 108 and/or of segments 106. As discussed, the openings 110 formed by the segments 106 and the flanges 108 may enable sufficient airflow through the fan guard 104. By way of example, the openings 110 may form between 80% to 90% of the surface area of the fan guard 104 along the plane cooperatively formed by the first axis 206 and the second axis 208. In other words, an opening percentage of the fan guard 104 is 80% to 90% to enable airflow therethrough.

Figure 6:
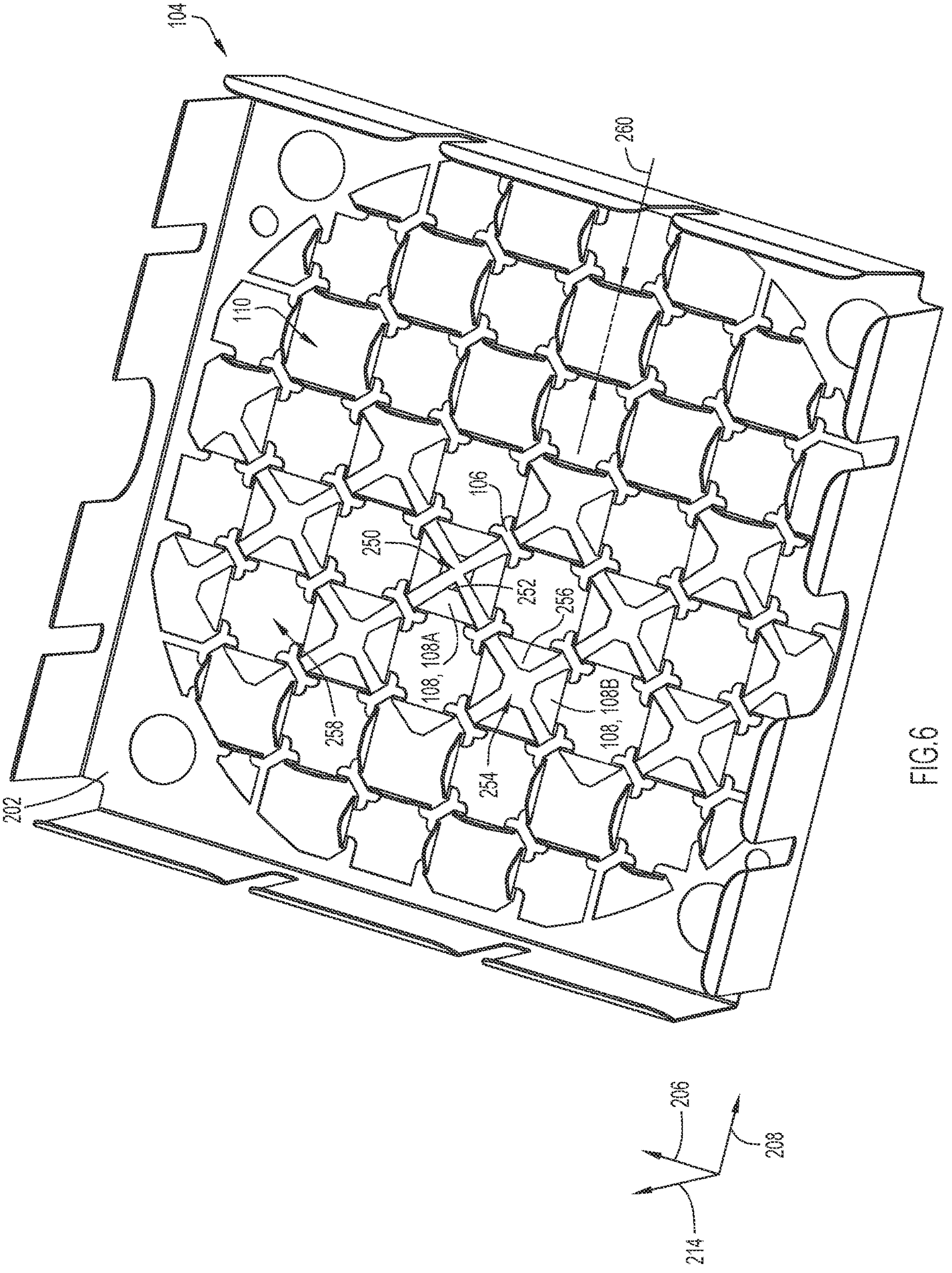
FIG. 6 is a rear perspective view of the fan guard of FIG. 3 prior to bending some flanges to form openings of the fan guard, according to an example embodiment.

FIG. 6 is a rear perspective view of the fan guard 104, which may be formed by bending the flanges 108 relative to the segments 106 to extend along the third axis 214 (e.g., to fully form corresponding openings 110). In the illustrated embodiment, a subset of the flanges 108 are not bent relative to the segments 106 and therefore extend along the first axis 206 and along the second axis 208 (e.g., and do not fully form corresponding openings 110) to provide a visualization of the shape of the flanges 108. For instance, the unbent flanges 108 indicate a shape of cuts made to remove material from the fan guard 104 (e.g., from the base 202) to form the flanges 108 and segments 106.

As an example, a first cut 250 (e.g., having an X shape) may be made to provide first flanges 108A having sharp tip portions 252. As such, each of the first flanges 108A may be triangularly shaped. The sharp tip portions 252 may increase extension of the first flanges 108A. Thus, upon bending the first flanges 108A relative to the segments 106, the first flanges 108A may extend at a relatively greater depth 216 along the third axis 214. As another example, a second cut 254 (e.g., having a reticle shape) may be made to provide second flanges 108B having flat tip portions 256 such that the second flanges 108B may have a trapezoidal shape. That is, the second flanges 108B may not include the sharp tip portions 252 and therefore may not extend as far as the first flanges 108A. Therefore, upon bending the second flanges 108B relative to the segments 106, the second flanges 108B may extend at a relatively shallower depth 216 along the third axis 214. As a further example, a third cut 258 (e.g., having a cross quadrate shape) may be made to provide an opening 110 without any flanges 108 extending into the opening 110 along the first axis 206 or along the second axis 208. That is, the third cut 258 may fully form an opening 110 without having to bend flanges 108. For instance, the third cut 258 may be made to form an opening 110 adjacent to an opening 110 formed by the first cut 250 or by the second cut 254 such that one of the corresponding flanges 108 (e.g., one of the first flanges 108A, one of the second flanges 108B) also at least partially defines the opening 110 formed by the third cut 258. That is, the opening 110 formed by the third cut 258 may be defined by flanges 108 that extend into openings 110 formed by the first cut 250 and/or by the second cut 254. Therefore, the third cut 258 may not have to form an opening 110 having additional flanges 108 (e.g., dedicated flanges 108 that are separate from those formed by the first cut 250 and/or by the second cut 254) that extend such an opening 110. In this manner, the third cut 258 may readily form an opening 110 without having to bend flanges 108, thereby facilitating an ease of manufacture of a portion of the fan guard 104.

Cuts different from the aforementioned first cut 250, second cut 254, and third cut 258 may additionally or alternatively be made. As an example, cuts that form flanges 108 having different amounts of extension and depths 216 and/or segments 106 that have a different geometry may be made. As another example, cuts that form a different quantity of flanges 108 and/or of segments 106 (e.g., a different quantity of segments 106 coupled to each flange 108, a different quantity of flanges 108 coupled to each segment 106) may be made. Indeed, a certain type of cut may be selected and made based on a desirable implementation of the fan guard 104, such as to create a certain pattern/size of openings 110 to achieve a target amount of airflow through the fan guard 104.

The different depths of the flanges 108 may adjust EMI attenuation provided by the fan guard 104. For example, flanges 108 having relatively greater depths 216 may be able to block relatively lower frequencies. As such, certain cuts creating the flanges 108 may be made to tune the EMI attenuation provided by the fan guard 104, such as based on EMI frequencies that are expected to be present in an implementation of the fan guard 104. By way of example, the fan guard 104 may be implemented in an environment in which EMI frequencies between 2 gigahertz (GHz) and 5 GHz are present (e.g., caused by operation of the fan 32, caused by operation of components separate from the fan 32), and flanges 108 having a particularly sized depth 216 may be made (e.g., via cuts) to attenuate such EMI frequencies. In this manner, the fan guard 104 may be particularly manufactured to attenuate certain EMI more suitably, which may help the electric device 20 and/or other system electronics achieve desirable operations.

Additionally, it should be noted that each opening 110 may span a dimension or distance 260 along the plane cooperatively formed by the first axis 206 and the second axis 208 to enable the fan guard 104 to have desirable EMI attenuation and/or airflow characteristics. For instance, the dimension 260 may span between flanges 108 located at opposite sides of an opening 110. Thus, a particularly sized dimension 260 of an opening 110 may be provided by creating the flanges 108 having a certain geometry and then bending such flanges 108. The openings 110 may be sized to have a dimension 260 that is sufficiently small to ensure that there is enough material at different portions of the fan guard 104 to be able to attenuate EMI desirably. As an example, forming flanges 108 to create an opening 110 that has too large of the dimension 260 may provide an excessive amount of spacing between the flanges 108 to reduce the ability of the fan guard 104 to attenuate EMI. However, forming flanges 108 to create an opening 110 that has too small of the dimension 260 may not provide such flanges 108 with enough material to extend in the third axis 214 to attenuate EMI. Additionally or alternatively, creating openings 110 having too small of the dimension 260 may reduce an area occupied by the openings 110, thereby reducing the amount of airflow that may be directed through the fan guard 104. Therefore, openings 110 having a particularly sized dimension 260 may be provided to attenuate EMI while enabling sufficient airflow through the fan guard 104. By way of example, the dimension 260 may be a value between 3.8 mm and 5 mm (i.e., between 1.5 inches and 2 inches) and may therefore be greater than 2.5 times the depth 216 of the flanges 108. In other words, a ratio of the dimension 260 relative to the depth 216 of each flange 108 is greater than 2.5. However, the specific configuration (e.g., size, shape) of the openings 110 may be dependent on other parameters of the fan guard 104, such as the pattern of the openings 110 and/or the desired depth 216 of the flanges 108.

Figure 7:
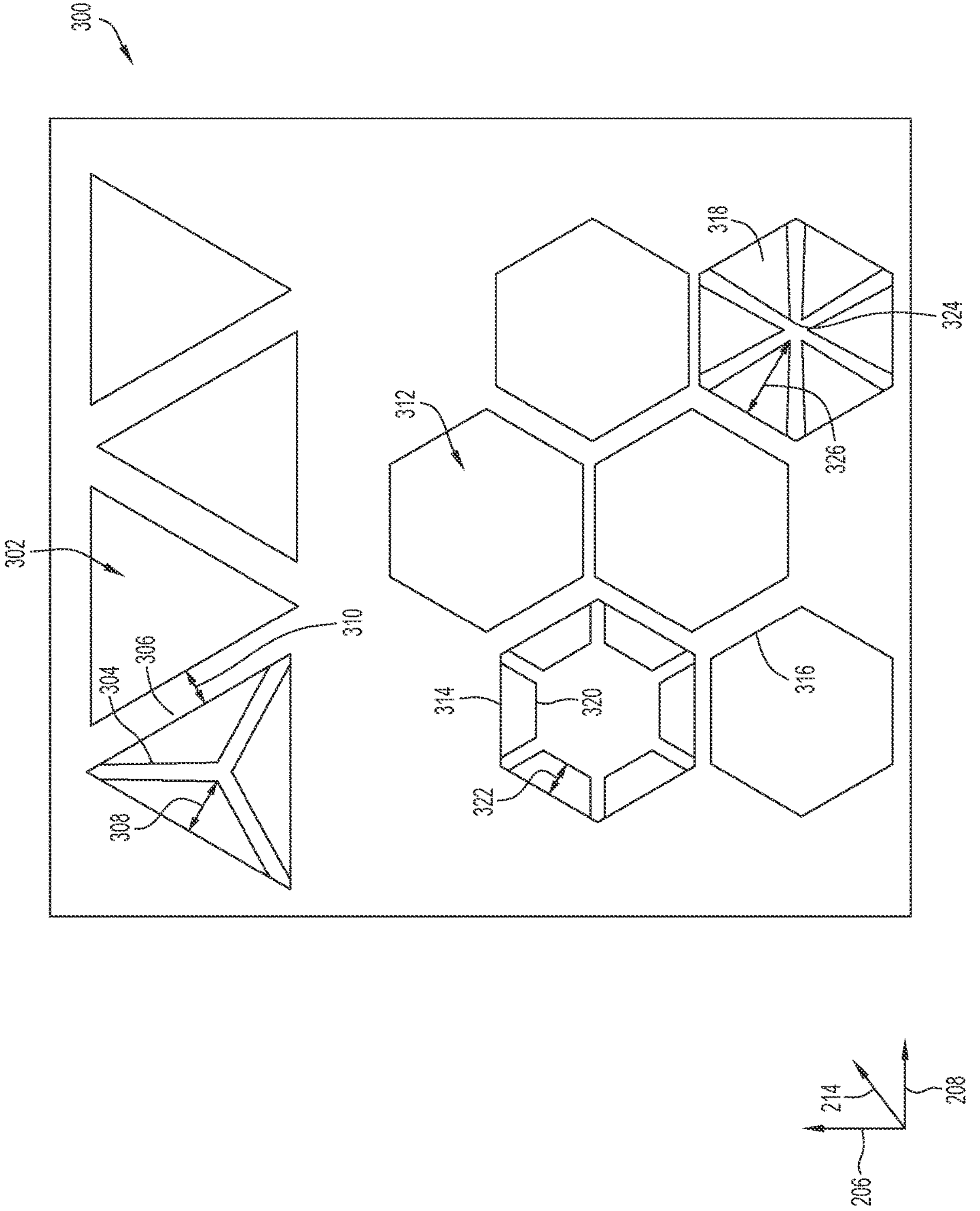
FIG. 7 is a schematic diagram of a fan guard having differently shaped openings, according to an example embodiment.

FIG. 7 is a schematic diagram of a fan guard 300 having differently sized openings. For example, the fan guard 300 may include first openings 302 that are triangularly shaped. The first openings 302 may be formed by creating first flanges 304 and first segments 306 (e.g., by making cuts into the material of the fan guard 300), then bending the first flanges 304 relative to the first segments 306 to fully form the first openings 302. In such embodiments, each first flange 304 may partially form one of the sides of the first openings 302, and each first flange 304 may have a triangular shape. As an example, cuts may be formed into the material of the fan guard 300 to form first flanges 304 that have a particular depth 308 and first segments 306 that have a particular width 310. Thus, upon bending the first flanges 304 relative to the first segments 306, the first flanges 304 may extend a suitable amount along the third axis 214 to attenuate EMI desirably, and the first openings 302 may be sufficiently sized and spaced apart to enable a desirable amount of airflow through the fan guard 300.

The fan guard 300 may also include second openings 312 that are hexagonally shaped. The second openings 312 may be formed by creating second flanges 314 and second segments 316 and/or by creating third flanges 318 and second segments 316, then bending the corresponding flanges 314, 318 relative to the second segments 316. The second flanges 314 may have a flat tip portion 320 and have a relatively smaller depth 322 (e.g., each second flange 314 may have a trapezoidal shape), whereas the third flanges 318 may have a sharp tip portion 324 and have a relatively larger depth 326 (e.g., each third flange 318 may have a triangular shape). For instance, the varying depths 322, 326 of the flanges 314, 318 may adjust the EMI being attenuated by the fan guard 300. As such, cuts that provide the flanges 314, 318 may be suitably made to the fan guard 300 to tune the EMI that is desired to be attenuated.

It should be noted that any other suitably shaped openings may be formed, such as by making cuts that form flanges coupled to and extending from segments. Additionally, for each opening, the flanges may have any suitable shape, such as a shape that provides a sufficient depth of extension to attenuate EMI. By way of example, the shape of the openings and/or of the flanges, along with a size of the openings and/or of the flanges, may be provided based on the EMI (e.g., a range of frequencies) to be attenuated and/or an amount of airflow to be directed.

Figure 8:
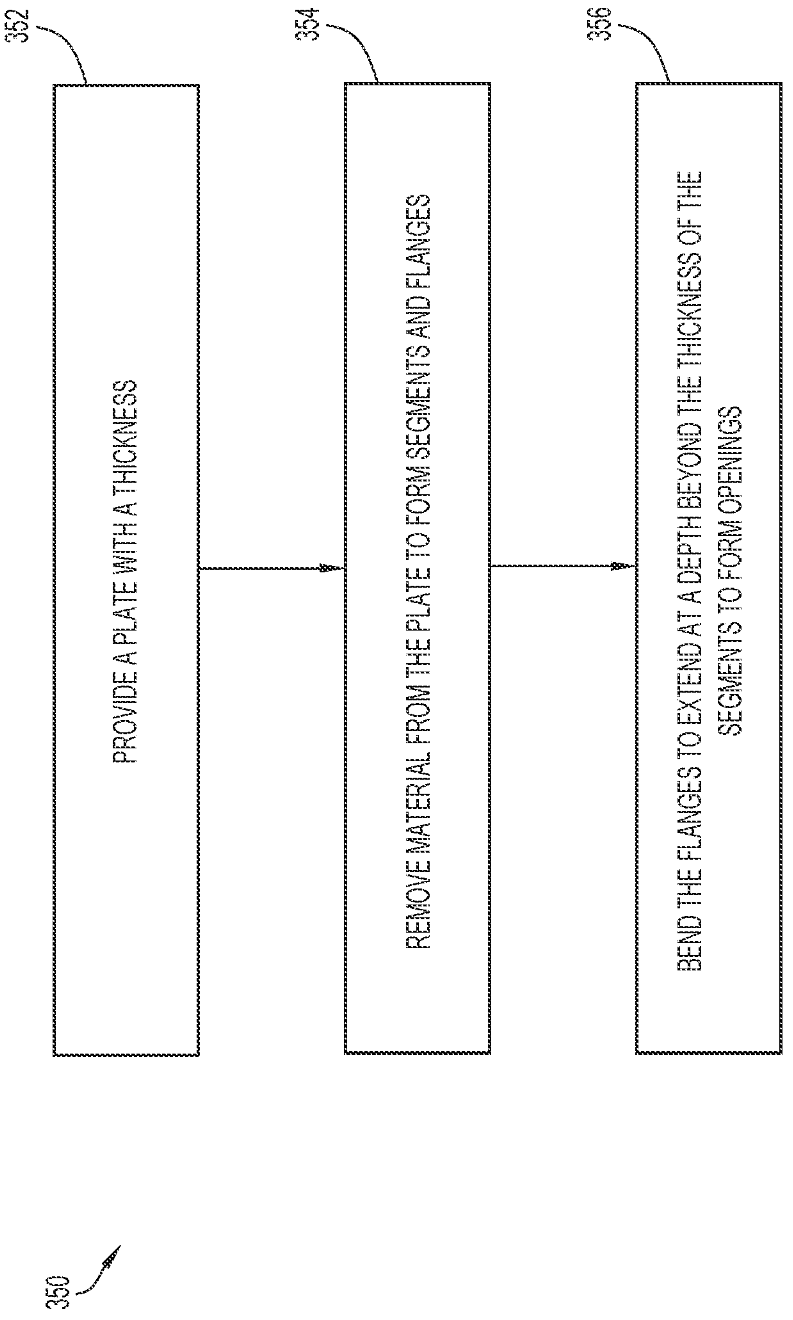
FIG. 8 is a flowchart of a method for manufacturing a fan guard having bent flanges, according to an example embodiment.

FIG. 8 is a flowchart of a method 350 for manufacturing a fan guard, such as any of the fan guards 104, 300. It should be noted that the method 350 may be performed differently than depicted. For example, an additional operation may be performed, and/or any of the depicted operations may be performed differently, performed in a different order, and/or not performed.

At step 352, a plate with a certain thickness may be provided. For example, the plate is composed of a sufficiently malleable material, such as a metal, to enable the plate to be readily deformable and also to provide EMI attenuation properties. At step 354, material is removed from the plate to form segments and flanges, each extending planar to one another and having a thickness similar to that originally of the plate. In some embodiments, material is removed via a stamping or punching technique in which material is pressed out of the plate (e.g., via a tool and die). In additional or alternative embodiments, material is removed via a cutting technique (e.g., via a mill, a lathe, a drill, a blade, a laser, a waterjet). Removing material from the plate may partially form openings through the plate.

At step 356, the flanges may be bent about the segments to extend at a depth beyond the thickness of the segments. Consequently, the segments and flanges may no longer extend planar to one another. For example, the depth of the flanges may extend perpendicular to the thickness of the segments such that the thickness of the flanges and the thickness of the segments are oriented perpendicular to one another. Bending the flanges may also fully form the openings through the plate. The openings may be positioned adjacent to one another along a plane of the plate, and the flanges may extend transverse to the plane.

By bending the flanges to extend beyond the thickness of the segments, the openings formed through the plate may have a sufficient size to enable a desirable amount of airflow through the plate in a direction along which the flanges extend. Additionally, such an orientation of the flanges may provide a sufficient amount of material to attenuate EMI (e.g., a range of EMI frequencies) desirably. As such, bending the flanges may sufficiently deform the plate to provide a fan guard that can be attached to a fan for directing airflow through an electrical device while maintaining desirable operation of the electrical device by limiting EMI directed to and/or from the electrical device.

Although the method 350 is particularly directed to forming the fan guard by bending flanges, it should be noted that any of the fan guards discussed herein may be performed by another suitable technique. As an example, a fan guard having integral segments and flanges that extend beyond a thickness of the segments may be manufactured by a metal casting technique, a metal extrusion technique, a molding technique, a machining technique, and so forth. As another example, a fan guard having separate segments and flanges that extend beyond a thickness of the segments may be manufactured by separately manufacturing the segments and flanges and then coupling the segments and flanges to one another. Indeed, a fan guard created by any of these manufacturing techniques may provide desirable EMI attenuation and airflow characteristics, such as based on the size of the created flanges and/or openings.

Furthermore, additional operations may be performed with respect to the plate. As an example, a hole may be formed through the plate to enable the plate to be coupled to another component, such as a frame and/or an attachment assembly (e.g., via a fastener extending through the hole). As another example, tabs may be formed at the plate and bent to further facilitate coupling to another component (e.g., via an interference fit with the tabs). Thus, such additional operations may facilitate implementation and/or assembly of the fan guard.

In some aspects, the techniques described herein relate to a fan guard including: a plurality of segments, wherein each segment of the plurality of segments includes a face extending along a plane and a thickness extending transverse to the plane; and a plurality of flanges, wherein each flange of the plurality of flanges is connected to a respective segment of the plurality of segments to cooperatively form an array of openings, wherein openings of the array of openings are adjacent to one another along the plane to enable flow of air directed transverse to the plane, and each flange has a depth extending transverse to the plane, the depth being greater than the thickness of each segment of the plurality of segments.

In some aspects, the techniques described herein relate to a fan guard, wherein a ratio of the depth of each flange of the plurality of flanges relative to the thickness of each segment of the plurality of segments is greater than 2.

In some aspects, the techniques described herein relate to a fan guard, wherein an opening percentage of the fan guard defined by the array of openings is greater than 80%.

In some aspects, the techniques described herein relate to a fan guard, wherein a first flange of the plurality of flanges is positioned to define a first side of an opening of the array of openings, a second flange of the plurality of flanges is positioned to define a second side, opposite the first side, of the opening, the first flange is offset from the second flange by a distance along the plane, and a ratio of the distance relative to the depth of each flange of the plurality of flanges is greater than 2.5.

In some aspects, the techniques described herein relate to a fan guard, wherein a segment of the plurality of segments is coupled to four flanges of the plurality of flanges.

In some aspects, the techniques described herein relate to a fan guard, wherein the plurality of flanges is oriented relative to the plurality of segments such that the depth of each flange of the plurality of flanges extends perpendicular to the face of each segment of the plurality of segments.

In some aspects, the techniques described herein relate to a fan guard, wherein each flange of the plurality of flanges includes an additional thickness, the additional thickness being substantially equal to the thickness of each segment of the plurality of segments.

In some aspects, the techniques described herein relate to a fan guard, wherein the plurality of flanges is oriented relative to the plurality of segments such that the additional thickness of each flange of the plurality of flanges extends perpendicular to the thickness of each segment of the plurality of segments.

In some aspects, the techniques described herein relate to a fan guard, wherein the plurality of segments and the plurality of flanges are configured to attenuate electromagnetic interference frequencies between 2 gigahertz (GHz) and 5 GHz.

In some aspects, the techniques described herein relate to an apparatus including: a plurality of fan blades configured to move to direct an airflow along an axis; and a fan guard including: a plurality of segments, wherein each segment of the plurality of segments includes a thickness extending along the axis along which the plurality of fan blades is configured to direct the airflow; and a plurality of flanges, wherein each flange of the plurality of flanges is coupled to a respective segment of the plurality of segments to cooperatively form an array of openings configured to receive the airflow directed by the plurality of fan blades along the axis, and each flange extends along the axis beyond the thickness of each segment of the plurality of segments.

In some aspects, the techniques described herein relate to an apparatus, wherein the plurality of flanges extends away from the plurality of fan blades.

In some aspects, the techniques described herein relate to an apparatus, wherein a thickness of each flange of the plurality of flanges extends transverse to the thickness of each segment of the plurality of segments.

In some aspects, the techniques described herein relate to an apparatus, wherein a flange of the plurality of flanges is coupled to two segments of the plurality of segments.

In some aspects, the techniques described herein relate to an apparatus, wherein each flange of the plurality of flanges extends a depth of greater than 1 millimeter along the axis.

In some aspects, the techniques described herein relate to an apparatus, wherein a segment of the plurality of segments at least partially forms four adjacent openings of the array of openings.

In some aspects, the techniques described herein relate to an apparatus including: a plurality of segments of a fan guard, wherein each segment of the plurality of segments includes a face extending along a plane and a thickness extending along an axis transverse to the plane; and a plurality of flanges of the fan guard, wherein the plurality of flanges is connected to the plurality of segments to cooperatively form a plurality of openings positioned adjacent to one another along the plane, and each flange of the plurality of flanges extends along the axis beyond the thickness of each segment of the plurality of segments.

In some aspects, the techniques described herein relate to an apparatus, wherein each segment of the plurality of segments has a thickness of less than 1 millimeter.

In some aspects, the techniques described herein relate to an apparatus, wherein each opening of the plurality of openings spans greater than 3.8 mm along the plane.

In some aspects, the techniques described herein relate to an apparatus, further including: a base having a surface extending along the plane, wherein the base is coupled to a subset of the plurality of segments; and a plurality of tabs extending from the base along the axis to form a receptacle along the base.

In some aspects, the techniques described herein relate to an apparatus, further including a base having a surface extending along the plane, wherein the base is coupled to a subset of the plurality of segments, wherein the base includes a hole separate from the plurality of openings cooperatively formed by the plurality of segments and the plurality of flanges, and the hole is configured to receive a fastener to couple the fan guard to a frame of a fan.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

As used herein, the terms "approximately," "generally," "substantially," and so forth, are intended to convey that the property value being described may be within a relatively small range of the property value, as those of ordinary skill would understand. For example, when a property value is described as being "approximately" equal to (or, for example, "substantially similar" to) a given value, this is intended to convey that the property value may be within +/−5%, within +/−4%, within +/−3%, within +/−2%, within +/−1%, or even closer, of the given value. Similarly, when a given feature is described as being "substantially parallel" to another feature, "generally perpendicular" to another feature, and so forth, this is intended to convey that the given feature is within +/−5%, within +/−4%, within +/−3%, within +/−2%, within +/−1%, or even closer, to having the described nature, such as being parallel to another feature, being perpendicular to another feature, and so forth. Mathematical terms, such as "parallel" and "perpendicular," should not be rigidly interpreted in a strict mathematical sense, but should instead be interpreted as one of ordinary skill in the art would interpret such terms. For example, one of ordinary skill in the art would understand that two lines that are substantially parallel to each other are parallel to a substantial degree, but may have minor deviation from exactly parallel.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A fan guard comprising:

a plurality of segments, wherein each segment of the plurality of segments comprises a face extending along a plane and a thickness extending transverse to the plane; and a plurality of flanges, wherein each flange of the plurality of flanges is connected to a respective segment of the plurality of segments to cooperatively form an array of openings, wherein openings of the array of openings are adjacent to one another along the plane to enable flow of air directed transverse to the plane, and each flange of the plurality of flanges has a depth extending transverse to the plane, the depth extending transverse to the plane being greater than the thickness extending transverse to the plane of each segment of the plurality of segments, and wherein at least a first flange of the plurality of flanges is arranged to define at least a first opening of the plurality of openings, and wherein the first flange is arranged to further define a second opening of the plurality of openings.

2. The fan guard of claim 1, wherein a ratio of the depth of each flange of the plurality of flanges relative to the thickness of each segment of the plurality of segments is greater than 2, and wherein the plurality of flanges is arranged to attenuate electromagnetic interference (EMI).

3. The fan guard of claim 1, wherein an opening percentage of the fan guard defined by the array of openings is greater than 80%.

4. The fan guard of claim 1, wherein the first flange of the plurality of flanges is positioned to define a first side of an opening of the array of openings, a second flange of the plurality of flanges is positioned to define a second side, opposite the first side, of the opening, the first flange is offset from the second flange by a distance along the plane, and a ratio of the distance relative to the depth of each flange of the plurality of flanges is greater than 2.5.

5. The fan guard of claim 1, wherein a segment of the plurality of segments is coupled to four flanges of the plurality of flanges, wherein the four flanges of the plurality of flanges includes the first flange and the four flanges define the first opening of the plurality of openings.

6. The fan guard of claim 1, wherein the plurality of flanges is oriented relative to the plurality of segments such that the depth of each flange of the plurality of flanges extends perpendicular to the face of each segment of the plurality of segments.

7. The fan guard of claim 1, wherein each flange of the plurality of flanges comprises an additional thickness, the additional thickness being substantially equal to the thickness of each segment of the plurality of segments.

8. The fan guard of claim 1, wherein the plurality of segments and the plurality of flanges are configured to attenuate electromagnetic interference frequencies between 2 gigahertz (GHz) and 5 GHz.

9. A fan guard comprising:

a plurality of segments, wherein each segment of the plurality of segments comprises a face extending along a plane and a thickness extending transverse to the plane; and a plurality of flanges, wherein each flange of the plurality of flanges is connected to a respective segment of the plurality of segments to cooperatively form an array of openings, each flange of the plurality of flanges having an additional thickness, the additional thickness being substantially equal to the thickness of each segment of the plurality of segments, wherein openings of the array of openings are adjacent to one another along the plane to enable flow of air directed transverse to the plane, and each flange of the plurality of flanges has a depth extending transverse to the plane, the depth being greater than the thickness of each segment of the plurality of segments, wherein the plurality of flanges is oriented relative to the plurality of segments such that the additional thickness of each flange of the plurality of flanges extends perpendicular to the thickness of each segment of the plurality of segments.

10. An apparatus comprising:

a plurality of fan blades configured to move to direct an airflow along an axis; and a fan guard comprising:

a plurality of segments, wherein each segment of the plurality of segments comprises a thickness extending along the axis along which the plurality of fan blades is configured to direct the airflow; and a plurality of flanges, wherein each flange of the plurality of flanges has a depth and is coupled to a respective segment of the plurality of segments to cooperatively form an array of openings configured to receive the airflow directed by the plurality of fan blades along the axis, and each flange of the plurality of flanges extends along the axis beyond the thickness of each segment of the plurality of segments, and wherein the depth is greater than the thickness, and wherein at least a first flange of the plurality of flanges is arranged to define at least a first opening of the plurality of openings, and wherein the first flange is arranged to further define a second opening of the plurality of openings.

11. The apparatus of claim 10, wherein the plurality of flanges extends away from the plurality of fan blades.

12. The apparatus of claim 10, wherein a thickness of each flange of the plurality of flanges extends transverse to the thickness of each segment of the plurality of segments, and wherein the plurality of flanges is arranged to attenuate electromagnetic interference (EMI).

13. The apparatus of claim 10, wherein a flange of the plurality of flanges is coupled to two segments of the plurality of segments.

14. The apparatus of claim 10, wherein four flanges of the plurality of flanges define the first opening of the plurality of openings and includes the first flange.

15. The apparatus of claim 10, wherein a segment of the plurality of segments at least partially forms four adjacent openings of the array of openings.

16. An apparatus comprising:

a plurality of segments of a fan guard, wherein each segment of the plurality of segments comprises a face extending along a plane and a thickness extending along an axis transverse to the plane; and a plurality of flanges of the fan guard, wherein the plurality of flanges is connected to the plurality of segments to cooperatively form a plurality of openings positioned adjacent to one another along the plane, and each flange of the plurality of flanges extends along the axis beyond the thickness of each segment of the plurality of segments, and wherein at least a first flange of the plurality of flanges is arranged to cooperate to form a first opening of the plurality of openings, and wherein the first flange is further arranged to cooperate to form a second opening of the plurality of openings.

17. The apparatus of claim 16, wherein each segment of the plurality of segments has a thickness of less than 1 millimeter.

18. The apparatus of claim 16, wherein each opening of the plurality of openings spans greater than 3.8 mm along the plane.

19. The apparatus of claim 16, further comprising:

a base having a surface extending along the plane, wherein the base is coupled to a subset of the plurality of segments; and a plurality of tabs extending from the base along the axis to form a receptacle along the base.

20. The apparatus of claim 16, further comprising a base having a surface extending along the plane, wherein the base is coupled to a subset of the plurality of segments, wherein the base comprises a hole separate from the plurality of openings cooperatively formed by the plurality of segments and the plurality of flanges, and the hole is configured to receive a fastener to couple the fan guard to a frame of a fan, the plurality of being arranged to attenuate electromagnetic interference (EMI).

* * * * *